(12) United States Patent
Shin et al.

(10) Patent No.: US 7,083,338 B2
(45) Date of Patent: Aug. 1, 2006

(54) LITHOGRAPHY EQUIPMENT

(75) Inventors: Seon-Su Shin, Cheonan-si (KR);
Seong-Bong Kim, Cheonan-si (KR);
Yeong-Beom Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 87 days.

(21) Appl. No.: 10/973,397

(22) Filed: Oct. 27, 2004

(65) Prior Publication Data
US 2005/0089324 A1    Apr. 28, 2005

(30) Foreign Application Priority Data
Oct. 27, 2003   (KR) ...................... 10-2003-0075111
Aug. 4, 2004    (KR) ...................... 10-2004-0061399

(51) Int. Cl.
*G03D 5/00*    (2006.01)
(52) U.S. Cl. ...................................... 396/611; 414/940
(58) Field of Classification Search .................... None
See application file for complete search history.

(56) References Cited

U.S. PATENT DOCUMENTS

| | | | | |
|---|---|---|---|---|
| 5,730,574 | A * | 3/1998 | Adachi et al. | 414/225.01 |
| 6,454,472 | B1 * | 9/2002 | Kim et al. | 396/611 |
| 2002/0009902 | A1 * | 1/2002 | Hashiguchi et al. | 438/795 |
| 2005/0287821 | A1 * | 12/2005 | Higashi et al. | 438/780 |

\* cited by examiner

*Primary Examiner*—D. Rutledge (57) ABSTRACT

A lithography equipment is provided, which includes: a coater coating a substrate with resist; a first buffer storing the substrate supplied from the coater; a baker baking the substrate supplied from the first buffer; a first turn table rotating the substrate supplied from the baker; a first transferor communicating the substrate with the coater, the first buffer, the baker, and the first turntable; an exposer exposing light to the substrate supplied from the first turntable; a developer developing the resist on the substrate supplied from the exposer; and a second transferor communicating the substrate with the first turntable, the exposer, and the developer.

20 Claims, 7 Drawing Sheets

LITHOGRAPHY EQUIPMENT

BACKGROUND OF THE INVENTION (a) Field of the Invention

The present invention relates to a lithography equipment.

(b) Description of the Related Art

Flat panel displays including a liquid crystal display (LCD) and an organic light emitting diode (OLED) include a plurality of thin films formed by lithography process.

The lithography includes resist coating using a coater, light exposure using an exposer or an aligner, and development using a developer.

The coater, the exposer, and the developer are arranged adapted to an in-line system via transferors.

Since recently-available exposers are so effective to process substrates without pose, it is preferable that the substrates are continually taken into and off from the exposers. Furthermore, since the light-exposed resist is continuously subjected to chemical reaction, it is preferable that the substrates taken off from the exposer are immediately transferred into the developer.

However, the different process times of the above-described devices and the transferring time taken by the transferors cause loss time such as the rest time of the transferors or the exposer.

SUMMARY OF THE INVENTION

A lithography equipment is provided, which includes: a coater coating a substrate with resist; a first buffer storing the substrate supplied from the coater; a baker baking the substrate supplied from the first buffer; a first turn table rotating the substrate supplied from the baker; a first transferor communicating the substrate with the coater, the first buffer, the baker, and the first turntable; an exposer exposing light to the substrate supplied from the first turntable; a developer developing the resist on the substrate supplied from the exposer; and a second transferor communicating the substrate with the first turntable, the exposer, and the developer.

The first turntable and the first buffer may be vertically aligned.

The lithography equipment may further include a second turntable rotating the substrate supplied from the exposer.

The lithography equipment may further include a second buffer aligned vertical to the second turntable.

The second transferor further may communicate the substrate with the second buffer and the second turntable.

The first transferor may be disposed close to the coater, the baker, and the first turntable.

The first transferor may take off the substrate from the coater, take the substrate into and off from the first buffer and the baker, and take the substrate into the first turntable.

The second transferor may be disposed close to the first buffer, the exposer, and the second buffer.

The second transferor may take off the substrate from the first turntable, take the substrate into and off the exposer and the second buffer, and take the substrate into the second turntable.

The lithography equipment may further include an auxiliary exposer disposed between the second turntable and the developer.

The lithography equipment may further include a conveyor transferring the substrate from the second buffer to the auxiliary exposer and developer.

The lithography equipment may further include a third transferor disposed between the second turntable and the auxiliary exposer.

A lithography equipment is provided, which includes: a coater coating a substrate with resist; a first buffer storing the substrate supplied from the coater; a baker baking the substrate supplied from the first buffer; a first turn table rotating the substrate supplied from the baker; a first transferor communicating the substrate with the coater, the first buffer, the baker, and the first turntable; first and second exposers exposing light to the substrate supplied from the first turntable and spaced apart from each other; a second turntable mounting the substrate supplied from the first and the second exposers; a second transferor communicating the substrate with the first and the second exposers, and the first and the second turntables; and a developer developing the resist on the substrate supplied from the first and the second exposers.

The lithography equipment may further include a second buffer aligned vertical to the second turntable.

The second transferor may move between the first and the second turntables and the first and the second exposers. The lithography equipment may further include a third buffer disposed between the first exposer and the second exposer.

Alternatively, the lithography equipment may further include: a third buffer disposed between the first exposer and the second exposer and communicating the second transferor; and a third transferor communicating the substrate with the third buffer and the first and the second exposers.

A lithography equipment is provided, which includes: a coater coating a substrate with resist; a first buffer storing the substrate supplied from the coater; a baker baking the substrate supplied from the first buffer; a first turn table rotating the substrate supplied from the baker; a first transferor communicating the substrate with the coater, the first buffer, the baker, and the first turntable; first and second exposers exposing light to the substrate supplied from the first turntable; a second turntable mounting the substrate supplied from the first and the second exposers; a second transferor communicating the substrate with the second exposer and the first and the second turntables; a third transferor communicating the substrate with the first exposer and the first turntable; and a developer developing the resist on the substrate supplied from the first and the second exposers.

The second transferor may transfer the substrate on the first turntable that is transferred by the third transferor to the second turntable.

The lithography equipment may further include a second buffer aligned vertical to the second turntable.

BRIEF DESCRIPTION OF THE DRAWINGS

The present invention will become more apparent by describing embodiments thereof in detail with reference to the accompanying drawings in which.

DETAILED DESCRIPTION OF THE PREFERRED EMBODIMENTS

The present invention now will be described more fully hereinafter with reference to the accompanying drawings, in which preferred embodiments of the invention are shown. The present invention may, however, be embodied in many different forms and should not be construed as limited to the embodiments set forth herein. In the drawings, like numerals refer to like elements throughout.

Now, lithography equipments according to embodiments of the present invention will be described with reference to accompanying drawings.

Figure 1:
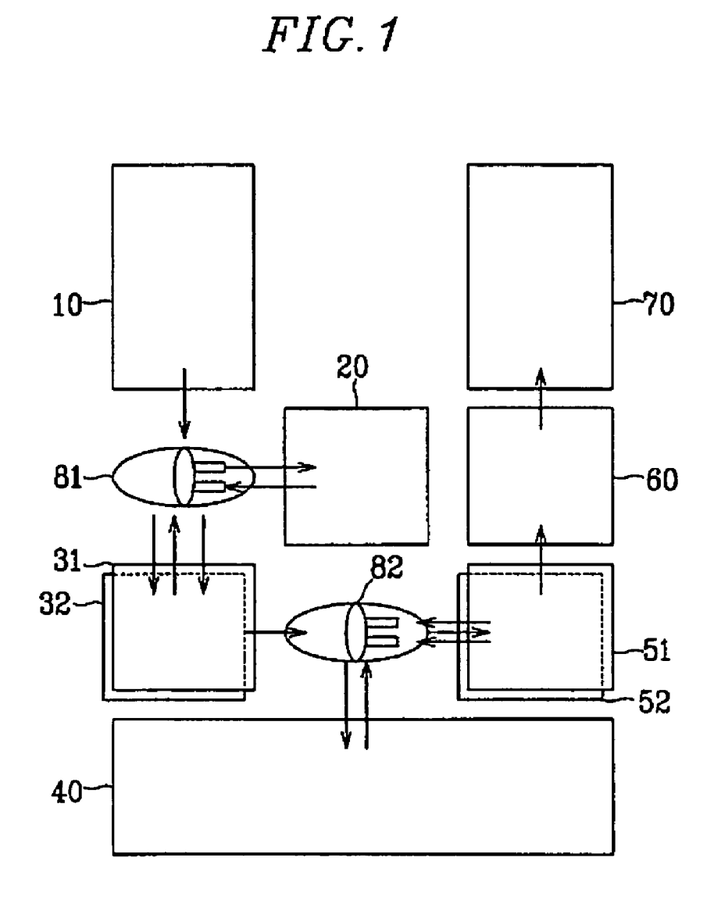
FIG. 1 is a schematic layout view of a lithography equipment according to an embodiment of the present invention.
Figure 2:
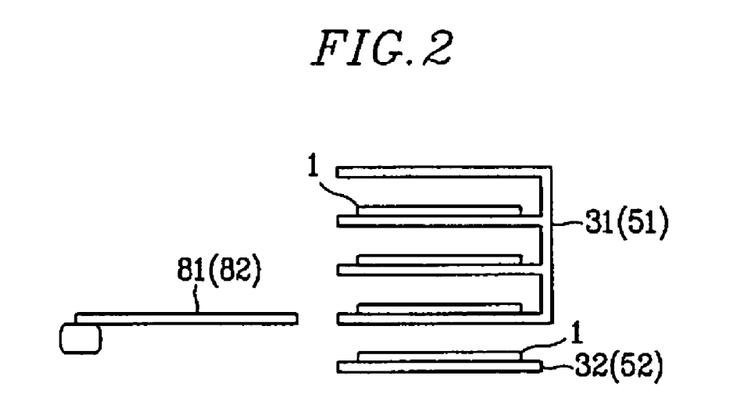
FIG. 2 is a schematic sectional view of a pair of a buffer and a turn table in the lithography equipment shown in FIG. 1.

Referring to FIGS. 1 and 2, a lithography equipment according to an embodiment of the present invention will be described in detail.

FIG. 1 is a schematic layout view of a lithography equipment according to an embodiment of the present invention and FIG. 2 is a schematic sectional view of a pair of a buffer and a turn table in the lithography equipment shown in FIG. 1.

Referring to FIG. 1, a lithography equipment according to this embodiment includes a coater 10, a baker 20, a pair of a first buffer 31 and a first turntable 32, an exposer (or an aligner) 40, a pair of a second buffer 51 and a second turntable 52, an edge exposer 60, a developer 70, and first and second transferors 81 and 82, which are arranged in a character "U."

The coater 10, the first transferor 81, and the first pair of the buffer 31 and the turntable 32 are aligned in series, and the developer 70, the edge exposer 60, and the second pair of the buffer 51 and the turntable 52 are aligned in series such that they are parallel to the coater 10, the first transferor 81, and the first pair of the buffer 31 and the turntable 32. The second transferor 82 is disposed between the first pair of the buffer 31 and the turntable 32 and the second pair of the buffer 51 and the turntable 52. The exposer 40 is disposed near the second transferor 82 and the baker 20 is disposed near the first transferor 81.

The coater 10 coats a substrate 1 with photoresist (not shown).

The baker 20 soft bakes the substrate 1 coated with the photoresist. The soft bake evaporates remnant solvent in the photoresist and enhances the adhesion between the photoresist and the substrate 1.

The exposer 40 aligns a mask (not shown), which has a primary pattern to be transferred to the substrate 1 for forming elements on the substrate 1, with the substrate 1 and exposes the substrate 1 to light through the mask.

The edge exposer 60 exposes the substrate 1 to light through another mask having a secondary pattern that may represent information about the substrate 1, etc and is disposed near the edges. A titler may be provided along with the edge exposer 60.

The developer 70 develops and hard bakes the photoresist on the substrate 1.

The buffers 31 and 51 and the turntables 32 and 52 temporarily store the substrate 1. Referring to FIG. 2, the turntables 32 and 52 that are rotatable are disposed below the buffers 31 and 32. However, the turntables 32 and 52 may be disposed over the buffers 31 and 51. The second buffer 51 may include a conveyor or may be omitted.

The first transferor 81 is surrounded by the coater 10, the baker 20, and the first pair of the buffer 31 and the turntable 32 to communicate the substrate 1 therewith and the second transferor 82 is surrounded by the first pair of the buffer 31 and the turntable 32, the exposer 40, and the second pair of the buffer 51 and the turntable 52 to communicate the substrate 1 therewith. The first and the second transferors 81 and 82 can rotate or move in a vertical direction and they may include robot arms that are movable in a horizontal plane.

The operation of the lithography equipment will be described in detail with reference to FIG. 3.

Figure 3:
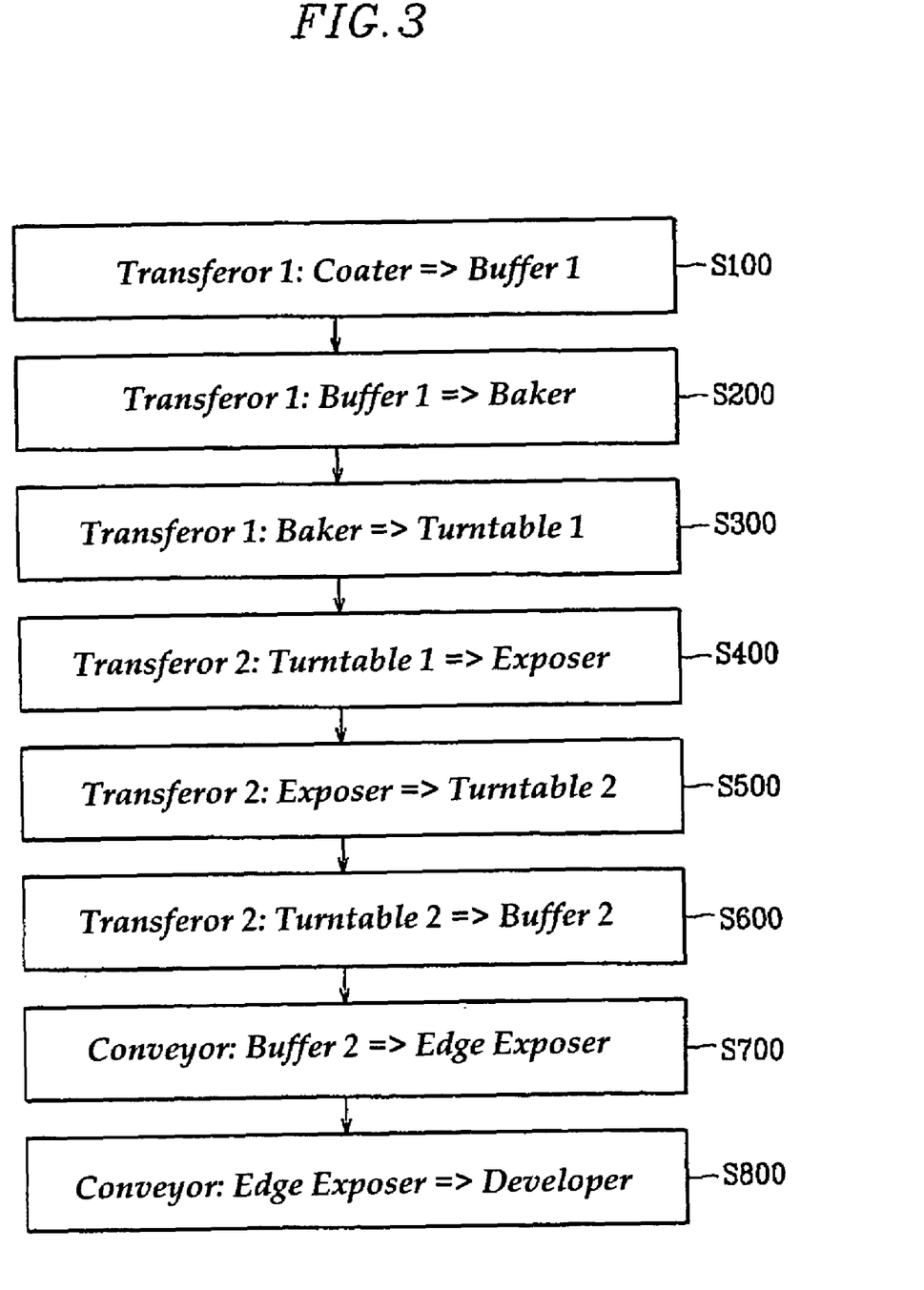
FIG. 3 is a flow chart illustrating the transfer of the substrate in the lithography equipment shown in FIGS. 1 and 2.

FIG. 3 is a flow chart illustrating the transfer of the substrate in the lithography equipment shown in FIGS. 1 and 2.

A substrate 1 is coated with photoresist (not shown) by the coater 10 and taken off from the coater 10 and taken into the first buffer 31 by the first transferor 81 (S100). The first buffer 31 temporarily stores the substrate 1 until the baker 20 is ready to process the substrate 1.

When the baker 20 is ready, the substrate 1 is taken out from the first buffer 31 and transferred to the baker 20 by the first transferor 81 (S200). The substrate 1 is soft baked by the baker 20 and taken off from the baker 20 and mounted on the first turntable 32 by the first transferor 81 (S300). In this case, the soft baking and the light exposure are sequentially performed without a rest. When a waiting time is required between the soft baking and the light exposure, the substrate 1 taken off from the baker 20 may be stored in the first buffer 31. However, it is also possible that the time for loading the substrate 1 into the baker 20 is controlled in consideration of the processing time difference between soft baking and the light exposure such that the soft baking and the light exposure are sequentially performed without a rest. That is, the loading time into the baker 20 is determined the processing time of the baker 20 and the time required for the exposer 40 to be ready. Then, the substrate 1 may be loaded into the baker 20 as earlier as the processing time of the baker 20 before the exposer 40 is ready.

The substrate 1 is rotated by the first turntable 32 and transferred to the exposer 40 by the second transferor 82 (S400). After the light exposure, the substrate 1 is taken off from the exposer 40 and loaded on the second turntable 52 by the second transferor 82 (S500).

The substrate 1 is rotated by the second turntable 52 and transferred to the second buffer 51 by the second transferor 82 (S600). The substrate 1 loaded on the second buffer 51 is transferred to the edge exposer 60 by a conveyor (not shown) (S700) and subjected to a secondary light exposure.

After the secondary light exposure, the substrate 1 is transferred to the developer 70 by a conveyor (not shown) (S800) and the photoresist coated on the substrate 1 is developed to form a desired pattern.

The above-described procedure is preferably designed according the tact time of the exposer 40. That is, the substrates 1 can be sequentially fed from the baker 20 to the exposer 40 without a rest such that the exposer 40 does not take a rest and the substrates 1 experienced light exposure by the exposer 40 are immediately transferred to the edge exposer 60 and then to the developer 70 in order to prevent the deterioration of the light-exposed photoresist.

As described above, two transferors 81 and 82 and two turntables 32 and 52 are provided between the baker 20 and the exposer 40, and the buffers 31 and 51 and the turntables 32 are 52 are vertically aligned. Accordingly, a bottle neck phenomenon is reduced to decrease the total tact time and thus the lithography equipment is effectively operated. Here, the tact time means a time taken by a device from feed-on of a substrate to take-off of the substrate, and the total tact time indicates a time taken by the lithography equipment from feed-on of a substrate to take-off of the substrate. In addition, the configuration of the lithography system is simplified.

Next, a lithography equipment according to another embodiment of the present invention will be described in detail with reference to FIG. 4.

Figure 4:
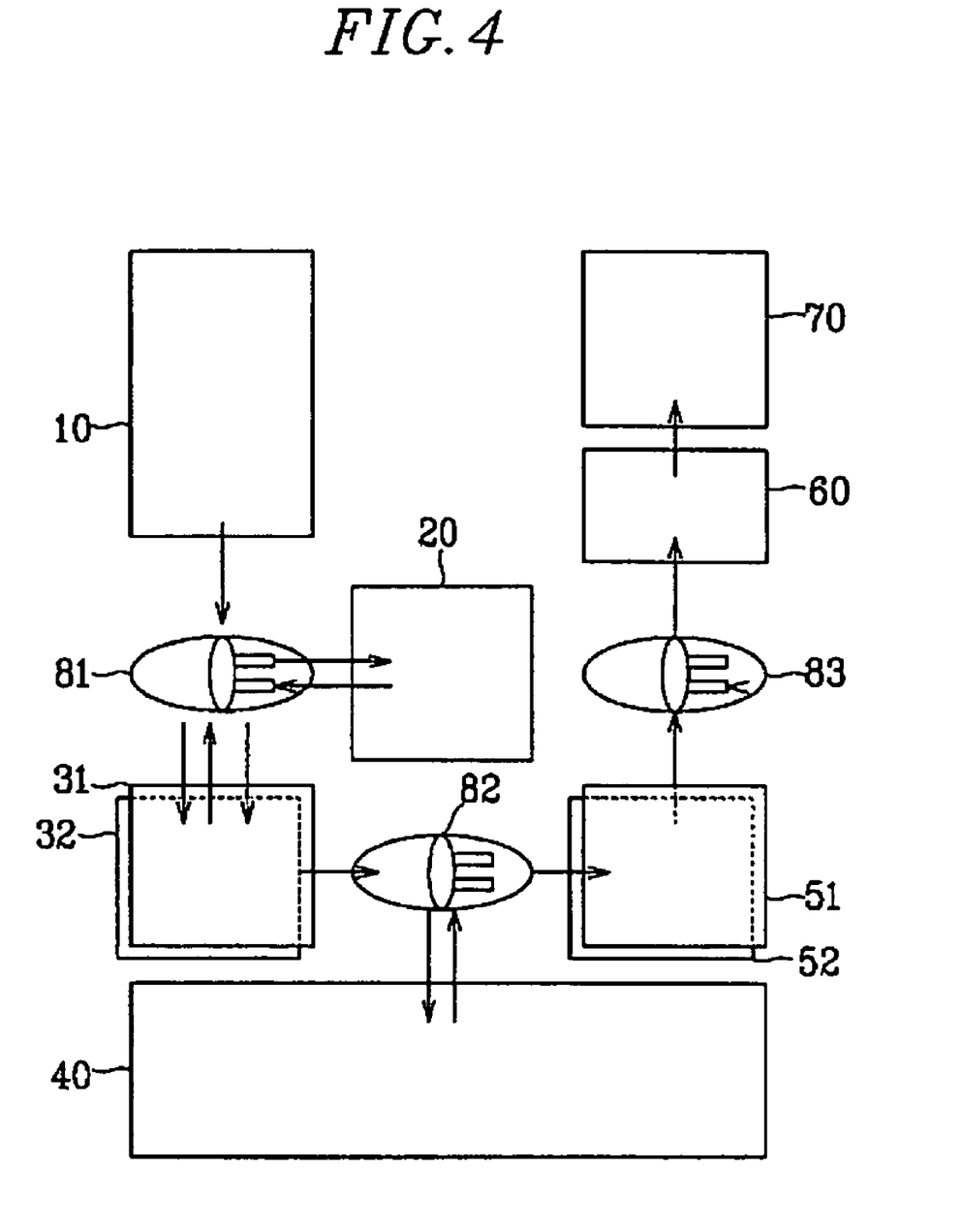
FIG. 4 is a schematic layout view of a lithography equipment according to another embodiment of the present invention.

FIG. 4 is a schematic layout view of a lithography equipment according to another embodiment of the present invention.

Like the lithography equipment shown in FIG. 1, a lithography equipment shown in FIG. 4 includes a coater 10, a baker 20, a pair of a first buffer 31 and a first turntable 32, an exposer (or an aligner) 40, a pair of a second buffer 51 and a second turntable 52, an edge exposer 60, a developer 70, and first and second transferors 81 and 82, and they are arranged in a manner similar to those shown in FIG. 1.

However, the lithography equipment according to this embodiment further includes a third transferor 83 disposed between the second turntable 52 and the edge exposer 60 unlike that shown in FIG. 1. The third transferor 83 takes off a substrate 1 disposed on the second buffer 51 and feed the substrate 1 to the edge exposer 60.

Many of the above-described features of the lithography equipment shown in FIGS. 1 and 2 may be appropriate to the lithography equipment shown in FIG. 4.

Next, a lithography equipment according to another embodiment of the present invention will be described in detail with reference to FIGS. 5 and 6.

Figure 5:
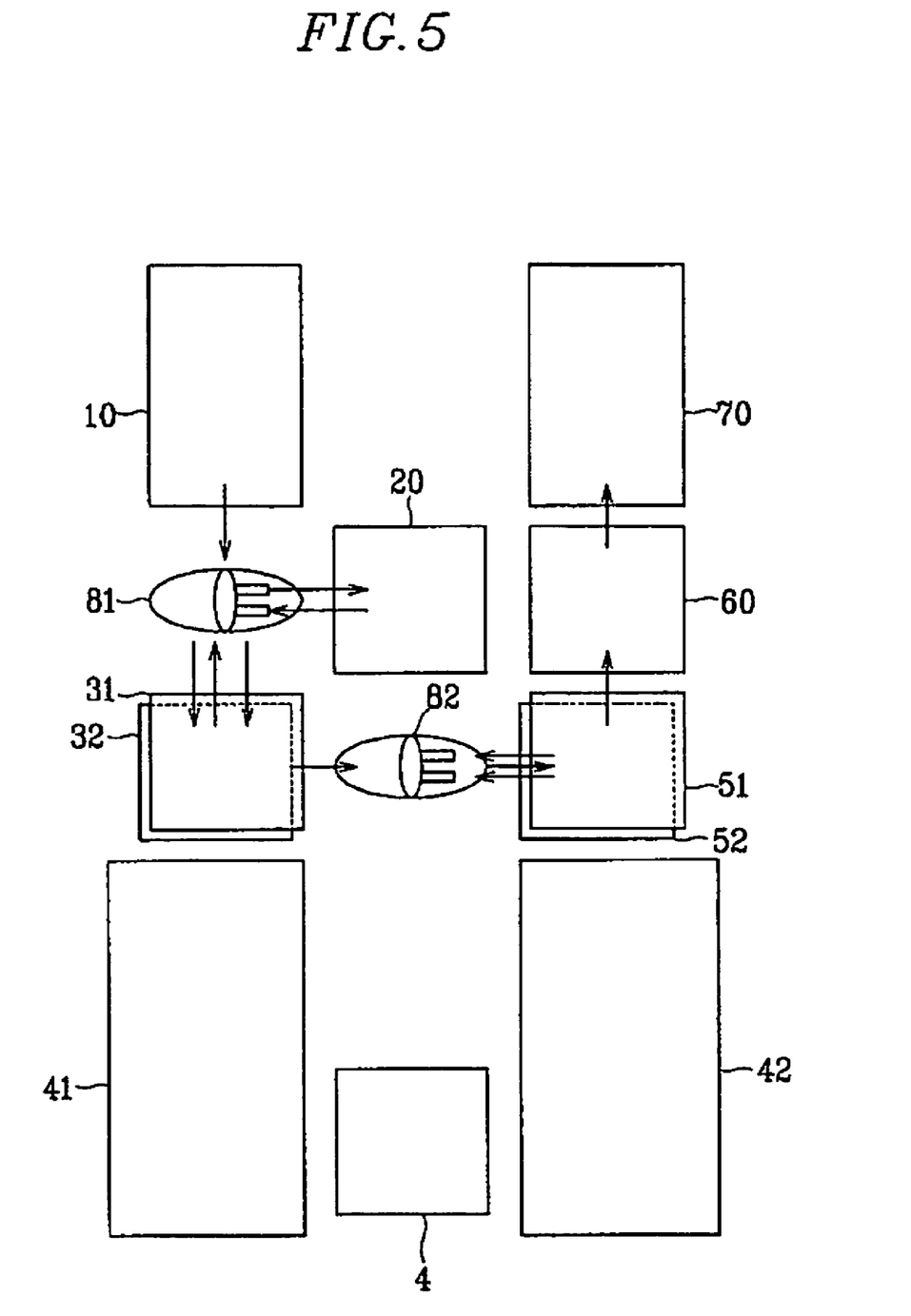
FIGS. 5 and 6 are schematic layout views of a lithography equipment according to another embodiment of the present invention.
Figure 6:
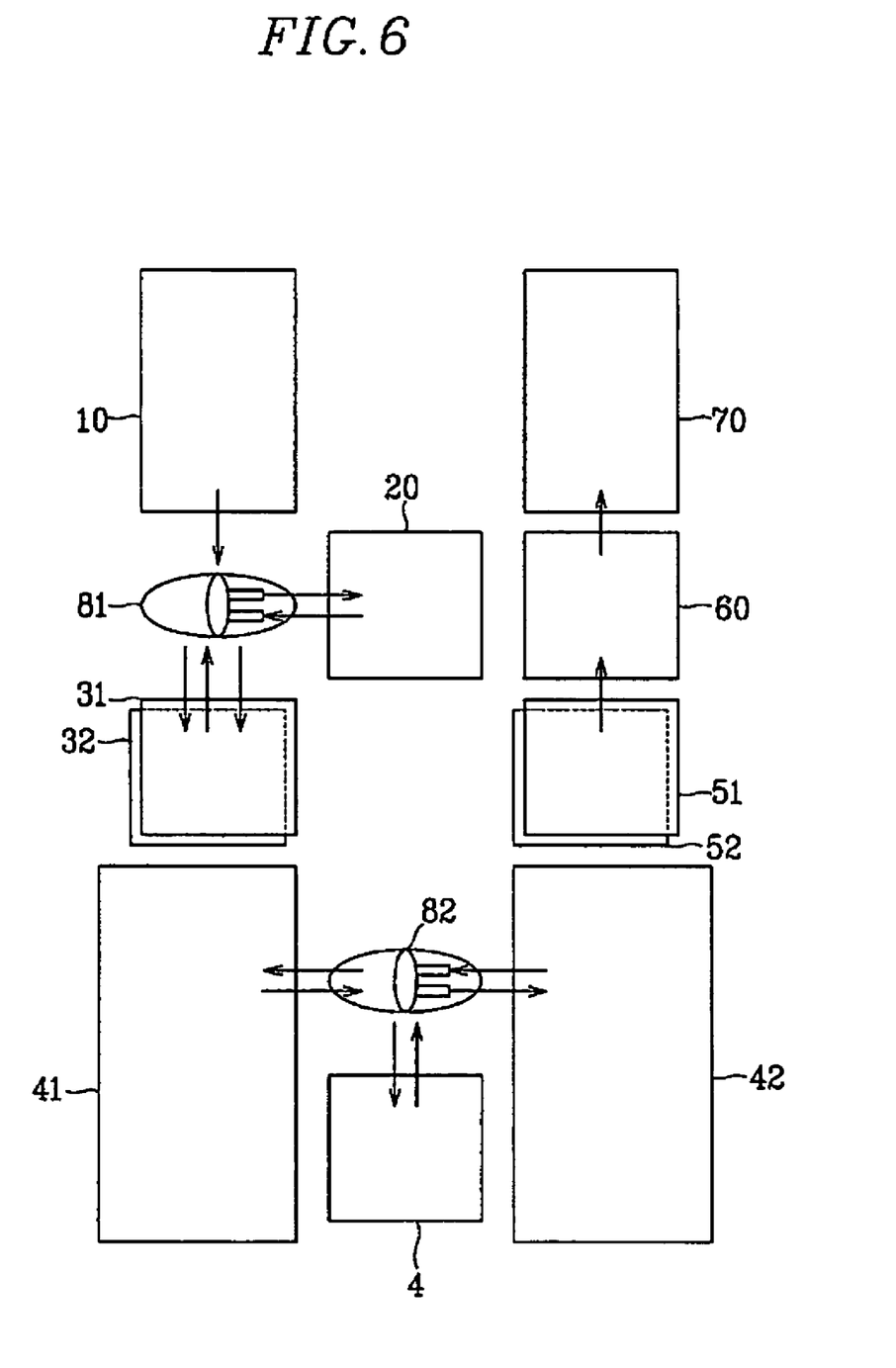

FIGS. 5 and 6 are schematic layout views of a lithography equipment according to another embodiment of the present invention.

Like the lithography equipment shown in FIG. 1, a lithography equipment shown in FIG. 4 includes a coater 10, a baker 20, a pair of a first buffer 31 and a first turntable 32, a pair of a second buffer 51 and a second turntable 52, an edge exposer 60, a developer 70, and first and second transferors 81 and 82, and they are arranged in a manner similar to those shown in FIG. 1.

However, the lithography equipment according to this embodiment includes a pair of first and second exposers 41 and 42 instead of a single exposer 40 shown in FIG. 1 and a third buffer 4 disposed between the exposers 41 and 42. The first exposer 41 is aligned with the coater 10, the first transferor 81, and the first pair of the buffer 31 and the turntable 32, while the second exposer 42 is aligned with the developer 70, the edge exposer 60, and the second pair of the buffer 51 and the turntable 52.

In addition, the first and the second exposers 41 and 42 are spaced apart from each other to form a path and the second transferor 82 moves from a position shown in FIG. 5 to a position shown in FIG. 6 along the path such that it can reach the third buffer 4 as well as the exposers 41 and 42, the first and the second buffers 31 and 51, and the first and the second turntables 32 and 52.

The second transferor 82 takes off a substrate 1 from the first turntable 32, moves to the exposers 41 and 42, and feed the substrate 1 into one of the exposers 41 and 42. After the light exposure, the second transferor 82 takes off the substrate 1 from the exposers 41 and 42, moves to the second turntable 52, and mounts the substrate 1 on the second turntable 52. The second transferor 82 repeats this operation. At this time, the third buffer 4 temporarily stores the substrate 1 until the exposers 41 and 42 are ready.

Accordingly, the lithography equipment according to this embodiment resolves the bottle neck before a single exposer. This system is effectively used for a photolithography process for forming a organic insulating layer on a substrate for a display panel such as a liquid crystal display panel since the exposure time for forming the organic insulating layer is somewhat longer than that for a normal photoresist and the tact time of the exposer is long.

Many of the above-described features of the lithography equipment shown in FIGS. 1 and 2 may be appropriate to the lithography equipment shown in FIGS. 5 and 6.

Next, a lithography equipment according to another embodiment of the present invention will be described in detail with reference to FIG. 7.

Figure 7:
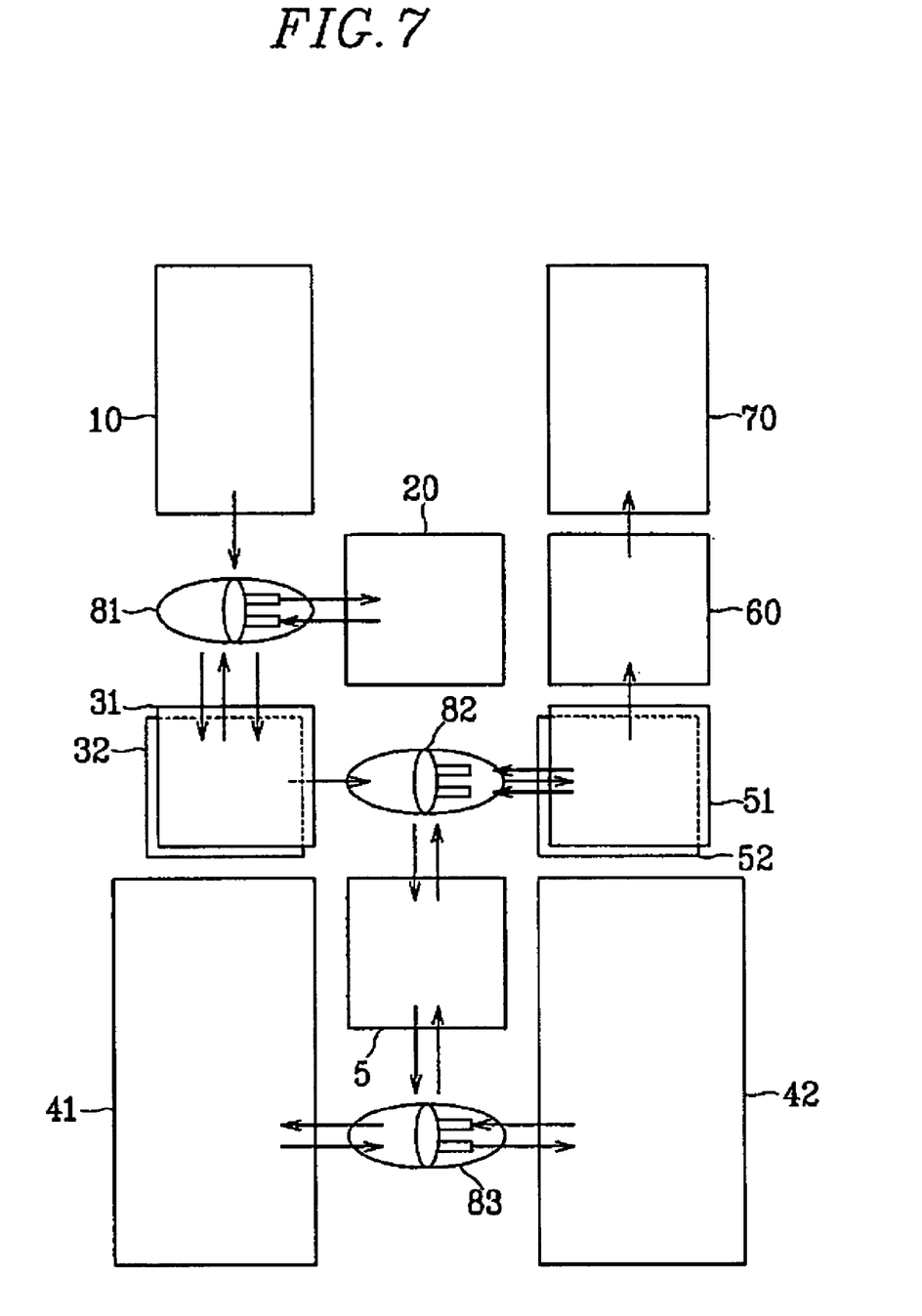
FIGS. 7 and 8 are schematic layout views of lithography equipments according to other embodiments of the present invention.

FIG. 7 is a schematic layout view of a lithography equipment according to another embodiment of the present invention.

Like the lithography equipment shown in FIGS. 5 and 6, a lithography equipment shown in FIG. 7 includes a coater 10, a baker 20, a pair of a first buffer 31 and a first turntable 32, a pair of first and second exposers (or aligners) 41 and 42, a pair of a second buffer 51 and a second turntable 52, an edge exposer 60, a developer 70, a third buffer 5, and first and second transferors 81 and 82, and they are arranged in a manner similar to those shown in FIGS. 5 and 6.

However, the lithography equipment according to this embodiment further includes a third transferor 83 disposed between the first exposer 41 and the second exposer 42 and the third buffer 5 is disposed between the second transferor 82 and the third transferor 83, unlike that shown in FIGS. 5 and 6. The second transferor 82 mounts a substrate 1, which is taken off from the first turntable 32, on the third buffer 5 instead of moving toward the first and the second exposers 41 and 42 and the third transferor 83 picks up the substrate 1 and transfers it to the first and the second exposers 41 and 42.

Many of the above-described features of the lithography equipment shown in FIGS. 5 and 6 may be appropriate to the lithography equipment shown in FIG. 7.

Next, a lithography equipment according to another embodiment of the present invention will be described in detail with reference to FIG. 8.

Figure 8:
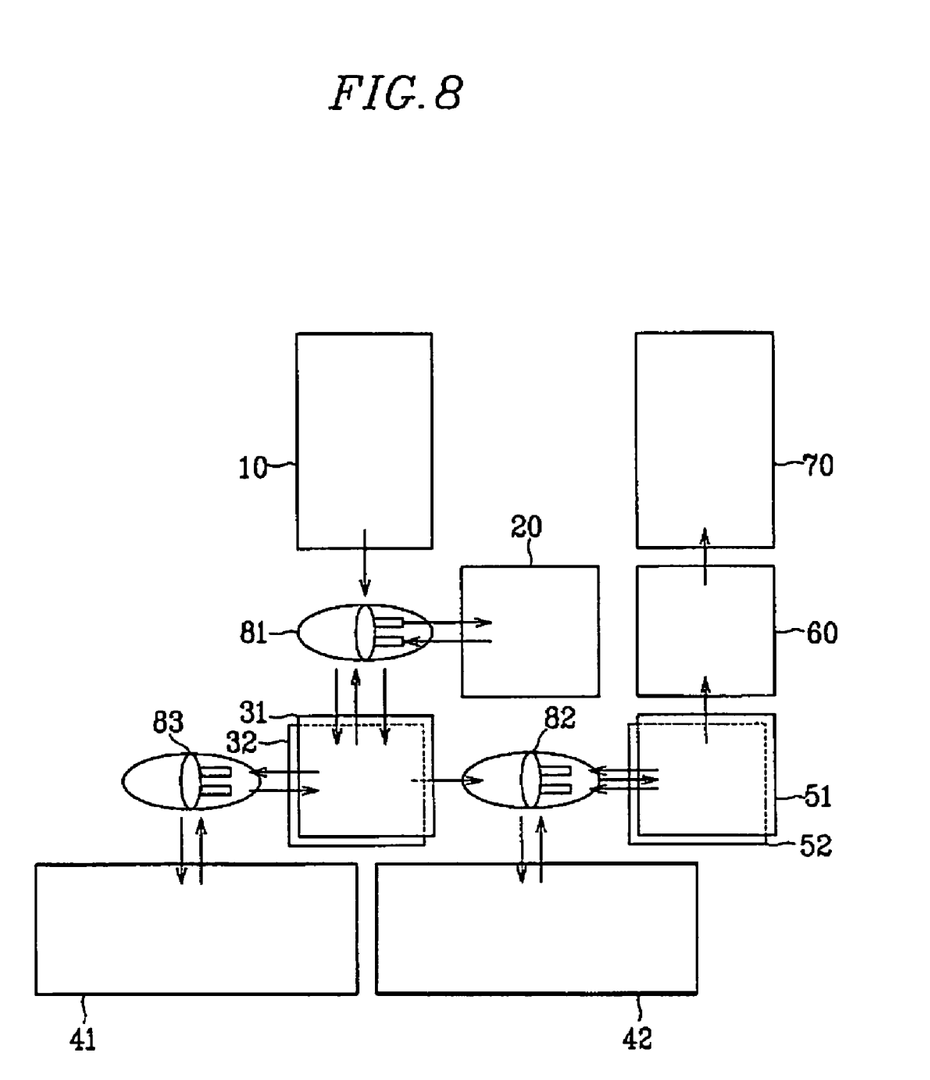

FIG. 8 is a schematic layout view of a lithography equipment according to another embodiment of the present invention.

Like the lithography equipment shown in FIGS. 5 and 6, a lithography equipment shown in FIG. 8 includes a coater 10, a baker 20, a pair of a first buffer 31 and a first turntable 32, a pair of first and second exposers (or aligners) 41 and 42, a pair of a second buffer 51 and a second turntable 52, an edge exposer 60, a developer 70, and first and second transferors 81 and 82, and they are arranged in a manner similar to those shown in FIGS. 5 and 6.

However, the lithography equipment according to this embodiment further includes a third transferor 83 disposed dose to the first pair of the buffer 31 and the turntable 32 and opposite the second transferor 82 and the first and the second exposers 41 and 42 are disposed dose to the third transferor 83 and the second transferor 82, respectively, unlike that shown in FIGS. 5 and 6. In addition, the lithography equipment according to this embodiment further includes no third buffer.

The third transferor 83 unload a substrate 1 from the first turntable 32, which can rotate in a range of about 180 degrees, and feed the substrate 1 to the first exposer 41, while the second transferor 82 feed a substrate 1, which is taken off from the first turntable 32, to the second exposer 42. After the light exposure in the first exposer 41, the third transferor 83 takes off the substrate 1 from the first exposer 41 and loads it on the first turntable 32. The first turntable 32 rotate about 180 degrees and the substrate 1 on the first turntable 32, which is transferred from the first exposer 41, is transferred to the second turntable 52 by the second transferor 82. The light-exposed substrate 1 in the second exposer 42 is taken off and transferred to the second turntable 52 by the second transferor 82.

Many of the above-described features of the lithography equipment shown in FIGS. 5 and 6 may be appropriate to the lithography equipment shown in FIG. 8.

As described above, the lithography equipments according to the embodiments of the present invention reduce the loss time during the transfer of the substrates and make the total tact time in harmony with the tact time of the exposer(s) by reducing the load on the transferors and by increasing the number of the exposers.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A lithography equipment comprising:
   a coater coating a substrate with resist;
   a first buffer storing the substrate supplied from the coater;
   a baker baking the substrate supplied from the first buffer;
   a first turn table rotating the substrate supplied from the baker;
   a first transferor communicating the substrate with the coater, the first buffer, the baker, and the first turntable;
   an exposer exposing light to the substrate supplied from the first turntable;
   a developer developing the resist on the substrate supplied from the exposer; and
   a second transferor communicating the substrate with the first turntable, the exposer, and the developer.

2. The lithography equipment of claim 1, wherein the first turntable and the first buffer are vertically aligned.

3. The lithography equipment of claim 1, further comprising a second turntable rotating the substrate supplied from the exposer.

4. The lithography equipment of claim 3, further comprising a second buffer aligned vertical to the second turntable.

5. The lithography equipment of claim 4, wherein the second transferor further communicates the substrate with the second buffer and the second turntable.

6. The lithography equipment of claim 5, wherein the first transferor is disposed close to the coater, the baker, and the first turntable.

7. The lithography equipment of claim 6, wherein the first transferor takes off the substrate from the coater, takes the substrate into and off from the first buffer and the baker, and takes the substrate into the first turntable.

8. The lithography equipment of claim 5, wherein the second transferor is disposed close to the first buffer, the exposer, and the second buffer.

9. The lithography equipment of claim 8, wherein the second transferor takes off the substrate from the first turntable, takes the substrate into and off the exposer and the second buffer, and takes the substrate into the second turntable.

10. The lithography equipment of claim 4, further comprising an auxiliary exposer disposed between the second turntable and the developer.

11. The lithography equipment of claim 10, further comprising a conveyor transferring the substrate from the second buffer to the auxiliary exposer and developer.

12. The lithography equipment of claim 10, further comprising a third transferor disposed between the second turntable and the auxiliary exposer.

13. A lithography equipment comprising:
    a coater coating a substrate with resist;
    a first buffer storing the substrate supplied from the coater;
    a baker baking the substrate supplied from the first buffer;
    a first turn table rotating the substrate supplied from the baker;
    a first transferor communicating the substrate with the coater, the first buffer, the baker, and the first turntable;
    first and second exposers exposing light to the substrate supplied from the first turntable and spaced apart from each other;
    a second turntable mounting the substrate supplied from the first and the second exposers;
    a second transferor communicating the substrate with the first and the second exposers, and the first and the second turntables; and
    a developer developing the resist on the substrate supplied from the first and the second exposers.

14. The lithography equipment of claim 13, further comprising a second buffer aligned vertical to the second turntable.

15. The lithography equipment of claim 13, wherein the second transferor moves between the first and the second turntables and the first and the second exposers.

16. The lithography equipment of claim 15, further comprising a third buffer disposed between the first exposer and the second exposer.

17. The lithography equipment of claim 13, further comprising:
    a third buffer disposed between the first exposer and the second exposer and communicating the second transferor; and
    a third transferor communicating the substrate with the third buffer and the first and the second exposers.

18. A lithography equipment comprising:
    a coater coating a substrate with resist;
    a first buffer storing the substrate supplied from the coater;
    a baker baking the substrate supplied from the first buffer;
    a first turn table rotating the substrate supplied from the baker;
    a first transferor communicating the substrate with the coater, the first buffer, the baker, and the first turntable;
    first and second exposers exposing light to the substrate supplied from the first turntable;
    a second turntable mounting the substrate supplied from the first and the second exposers;
    a second transferor communicating the substrate with the second exposer and the first and the second turntables;
    a third transferor communicating the substrate with the first exposer and the first turntable; and
    a developer developing the resist on the substrate supplied from the first and the second exposers.

19. The lithography equipment of claim 18, wherein the second transferor transfers the substrate on the first turntable that is transferred by the third transferor to the second turntable.

20. The lithography equipment of claim 18, further comprising a second buffer aligned vertical to the second turntable.

* * * * *